(12) United States Patent
Nishihara

(10) Patent No.: US 6,967,891 B2
(45) Date of Patent: Nov. 22, 2005

(54) INFORMATION PROCESSING APPARATUS AND SEMICONDUCTOR MEMORY

(75) Inventor: Toshiyuki Nishihara, Kanagawa (JP)

(73) Assignee: Sony Corporation, (JP)

(*) Notice: Subject to any disclaimer, the term of this patent is extended or adjusted under 35 U.S.C. 154(b) by 0 days.

(21) Appl. No.: 10/797,178

(22) Filed: Mar. 11, 2004

(65) Prior Publication Data

US 2004/0219740 A1 Nov. 4, 2004

(30) Foreign Application Priority Data

Mar. 17, 2003 (JP) .......................... P2003-072489

(51) Int. Cl.[7] .............................................. G11C 7/00
(52) U.S. Cl. ....................... 365/227; 365/145; 365/222
(58) Field of Search ............................... 365/227, 145, 365/222, 229

(56) References Cited

U.S. PATENT DOCUMENTS

| 4,873,664 A | 10/1989 | Eaton, Jr. | |
| 6,172,928 B1 * | 1/2001 | Ooishi | ........................ 365/222 |
| 6,418,075 B2 * | 7/2002 | Shimano et al. | ............ 365/227 |
| 6,421,281 B2 * | 7/2002 | Suzuki | ................... 365/189.09 |

FOREIGN PATENT DOCUMENTS

| JP | 05-062469 | 3/1993 |
| JP | 09-326200 | 12/1997 |
| JP | 11-162182 | 6/1999 |
| JP | 2000-011665 | 1/2000 |

* cited by examiner

Primary Examiner—Son Mai
(74) Attorney, Agent, or Firm—Rader, Fishman & Grauer, PLLC; Ronald P. Kananen

(57) ABSTRACT

An information processing apparatus or a semiconductor memory according to the present invention periodically refreshes a high-speed nonvolatile memory cell having spontaneous data storing capability at the time of nonuse of the apparatus (or at the time of standby of the memory) by refresh control element. Thus, a combination of the spontaneous data retaining capability of the nonvolatile memory cell, the periodic refresh at the time of nonuse, and intermittent power supply by turning on/off a switch circuit makes it possible to retain data reliably while minimizing power consumption at the time of standby. Thereby a memory system that can retain data reliably with minimum power consumption and enable high-speed access can be realized.

12 Claims, 7 Drawing Sheets

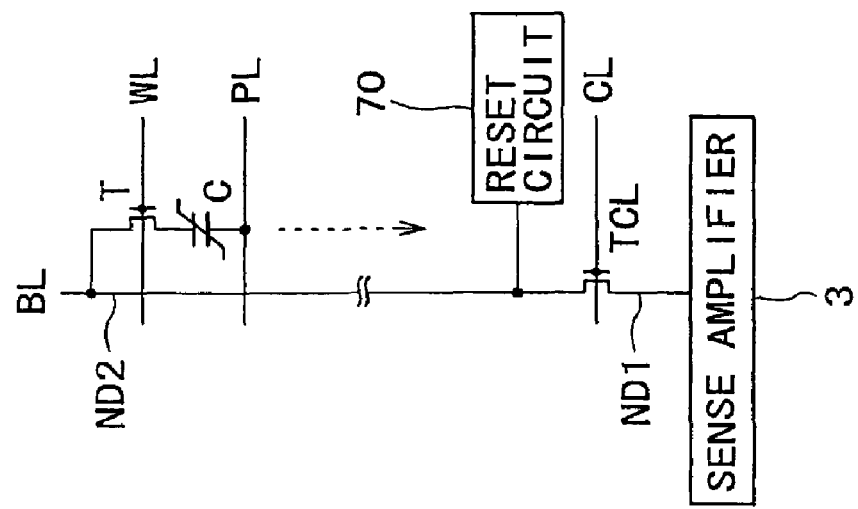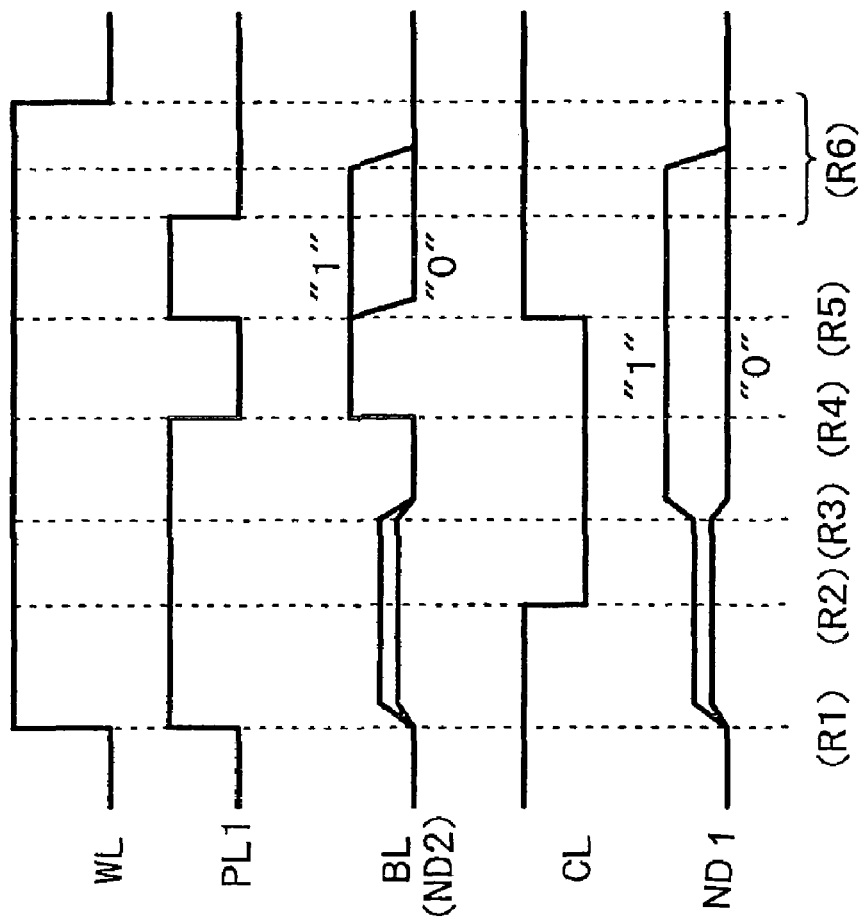

INFORMATION PROCESSING APPARATUS AND SEMICONDUCTOR MEMORY

BACKGROUND OF THE INVENTION

The present invention relates to a semiconductor memory and an information processing apparatus including the semiconductor memory.

New semiconductor nonvolatile memories capable of high-speed rewriting have recently been drawing attention. The nonvolatile memories utilize various materials capable of changing a state at high speed with low voltage and retaining the state spontaneously.

A typical example of the nonvolatile memories is a ferroelectric memory. A cell structure and operation of a currently mainstream ferroelectric memory are proposed in U.S. Pat. No. 4,873,664 of Patent Literature 1.

FIG. 1 illustrates an example of a method of realizing the ferroelectric memory. In this example, a memory cell is formed by one access transistor and one ferroelectric capacitor, and 1 bit is stored by complementarily writing data to a pair of memory cells, for example.

The example shown in FIG. 1 has memory cells MC11, MC21, MC31, MC41, MC12, MC22, MC32, and MC42 formed as a memory array. Each of the memory cells MC includes an access transistor and a ferroelectric capacitor. For example, the memory cell MC11 includes an access transistor T11 and a ferroelectric capacitor C11. The memory cell MC21 includes an access transistor T21 and a ferroelectric capacitor C21.

A word line decoder/driver 1 applies a voltage to a word line WL (WL1, WL2 . . . ) according to an address to be accessed.

The word line WL1 is connected with a gate electrode of each access transistor (T11, T12 . . . ) of a memory cell row including the memory cells MC11, MC21, MC31, and MC41.

The word line WL2 is connected with a gate electrode of each access transistor of a memory cell row including the memory cells MC12, MC22, MC32, and MC42.

Bit lines BL (BL1, BL2 . . . ) are arranged in a direction orthogonal to the word lines WL.

The bit lines BL1 and BL2, for example, are a bit line pair to which voltage is applied by a sense amplifier 3-1 and whose potential is detected by the sense amplifier 3-1. The bit lines BL3 and BL4 are a bit line pair to which voltage is applied by a sense amplifier 3-2 and whose potential is detected by the sense amplifier 3-2.

A plate line decoder/driver 2 applies a predetermined voltage to a plate line PL (PL1, PL2.) The plate line PL1 is connected with one terminal of each ferroelectric capacitor (C11, C21 . . . ) of the memory cell row including the memory cells MC11, MC21, MC31, and MC41.

The plate line PL2 is connected with one terminal of each ferroelectric capacitor of the memory cell row including the memory cells MC12, MC22, MC32, and MC42.

In each memory cell MC, the access transistor is turned on by the word line WL, whereby the memory cell MC is connected to the corresponding bit line BL.

In such a configuration, two ferroelectric capacitors are used to store 1 bit complementarily. Specifically, the ferroelectric capacitors C11 and C21 forming memory units MU11 and MU21 connected to the pair of bit lines BL1 and BL2 constitute a pair, and complementarily store data of 1 bit each by direction of polarization of the ferroelectric capacitors C11 and C21.

When "1" is to be written to the capacitor C11, for example, the word line WL1 is selected, the plate line PL1 is set to 0 V, and the bit lines BL1 and BL2 are driven to apply a voltage for providing a polarization direction of "1" to the capacitor C11. On the other hand, the capacitor C21 is made to have a polarization direction of "0."

At the time of reading, when the word line WL1 is selected and the plate line PL1 is driven, charge is discharged as complementary data from the capacitors C11 and C21 into the bit line pair BL1 and BL2. A potential difference caused by this is detected by the differential type sense amplifier 3-1, whereby data can be read.

States at the time of reading will be described with reference to a hysteresis loop of FIG. 2. An axis of abscissas indicates voltage applied to ferroelectric capacitors, and an axis of ordinates indicates amount of polarization.

In an initial state of reading, the plate line PL1 and the bit line pair BL1 and BL2 are equalized to 0V, and the bit lines BL1 and BL2 are in a floating state. The capacitors C11 and C21 forming a pair are polarized in directions opposite to each other. For example, the capacitor C11 is in an (H0) state, and the capacitor C21 is in an (H1) state in FIG. 2.

A pulse of voltage Vcc is applied to the plate line PL1, whereby substantially Vcc is applied to both the capacitors C11 and C21. Both the capacitors C11 and C21 are shifted to an (H2) state. Accordingly a signal difference corresponding to a difference in amount of polarization change from the initial state occurs between the bit lines BL1 and BL2.

That is, of the capacitors C11 and C21, only the capacitor C21 causes polarization inversion, and a signal difference corresponding to the inversion appears between the bit lines BL1 and BL2. Specifically, a potential of the bit line BL2 on a side where the polarization inversion occurred is increased. The signal difference is sensed by the differential sense amplifier 3-1, whereby data is obtained.

Further, the sense amplifier 3-1 is activated to amplify the voltage of the bit line BL1 to 0 V and the voltage of the bit line BL2 to the voltage Vcc.

At this time, while the capacitor C11 remains around (H2), zero voltage is applied to the capacitor C21, and the capacitor C21 is shifted to the (H0) state.

Next, the plate line PL1 is driven to 0 V again, whereby the voltages applied to the capacitors C11 and C21 are changed to zero and (−Vcc), respectively. At this time, the capacitor C11 returns to the (H0) state, while the capacitor C21 is shifted to an (H3) state, thus inverting the direction of polarization again. Finally, when the bit lines BL1 and BL2 are returned to 0 V, the capacitors C11 and C21 are restored to the (H0) state and the (H1) state, respectively. That is, data rewriting or refresh is performed.

Since the polarization of such ferroelectric film has a spontaneous state retention capability, the ferroelectric film continues storing data without power supply as long as opposed electrodes sandwiching the ferroelectric film are maintained at the same potential.

In addition, the above-mentioned polarization inversion can be performed in a short time of a few nanoseconds with an applied voltage of 3 V or lower. Thus, unlike flash memories, the ferroelectric memory does not require a large amount of time or current consumption for data writing.

Such a semiconductor memory is expected to be used for the following applications.

A main memory of many portable electronic apparatus, for example portable telephones and PDAs is now formed by a DRAM. In these apparatus, user data and applications are stored left extracted in the DRAM so as to be used immediately on turning on power. That is, data in the DRAM is retained even at a time of nonuse of the apparatus.

However, DRAM is volatile and is therefore not able to retain data spontaneously. Thus, in order to retain the data, current needs to be sent to a memory cell array at all times even during standby, and further a refresh operation needs to be performed at a high frequency. Therefore, even while not used, the apparatus consumes a few mW of current during the standby, thus requiring frequent battery change and extra battery cost.

In addition to the problem of such battery backup, there has recently been a movement spreading to reduce power consumption during standby of electric apparatus in general in consideration for the environment. Therefore, the current consumption for data retention during standby of a DRAM included in such household electric appliances is becoming a serious problem.

When a ferroelectric memory is used as a substitute for the DRAM, the current consumption during standby of the memory can be reduced to zero while maintaining access performance similar to that of the DRAM. Alternatively, when data extracted in the DRAM is transferred at high speed and stored in a high-speed storage formed by a ferroelectric memory, the current consumption during standby can be reduced to zero by stopping refresh of the DRAM.

Incidentally, while principles of a memory (FeRAM) using ferroelectric film have been described above, MRAM, which uses magnetic tunnel film and stores data by direction of magnetization of the magnetic film, OUM, which stores data by crystal state of chalcogenide film, and the like are proposed as memory capable of writing at high speed with low voltage and spontaneously retaining data as with the ferroelectric memory.

Memories that write data at high speed with low voltage and store data spontaneously as described above, such for example as FeRAM using ferroelectric film, MRAM using magnetic tunnel film, and OUM using chalcogenide film will hereinafter be referred to as a "high-speed nonvolatile memory."

Ideally, such a "high-speed nonvolatile memory" is capable of storing data spontaneously over a long period of time. The ability to write at high speed with low voltage, on the other hand, means a low energy barrier between different pieces of data. Therefore, the data retention of the high-speed nonvolatile memory is not so easy as that of a flash memory. For example, a small defect in film caused in a manufacturing process makes a retention period by far shorter than an ideal retention period. Nonvolatile memories generally ensure data retention for 10 years at 80° C. If the retention period is one day, a loss of data occurs in the memory, thus rendering the memory unusable.

Because of such a situation, it is very difficult to secure reliability of high-speed nonvolatile memories. An operating margin larger than necessary is generally included in design of high-speed nonvolatile memories to provide for degradation during data retention. A ferroelectric memory, for example, has a capacitor size twice or more larger than is necessary for normal sensing. Such a condition considerably hinders progress toward higher integration and increases bit cost.

As a measure against degradation during data retention of such a nonvolatile memory, refresh is considered.

For example, Japanese Patent Laid-open No. Hei 9-326200 of Patent Literature 2, though having a different object because of its assumption that a state of polarization of ferroelectric film remains, proposes periodic refresh during operation as a measure against a problem specific to a FET type ferroelectric memory (data cannot be obtained by normal reading after passage of time). Japanese Patent Laid-open No. Hei 9-326200 also proposes a startup mechanism that performs refresh at a time of turning on power by reading all data stored from polarization states by a special reading method and rewriting the data.

Japanese Patent Laid-open No. 2000-11665 of Patent Literature 3 and Japanese Patent Laid-open No. Hei 11-162182 of Patent Literature 4 propose refresh operation based on an external command. Japanese Patent Laid-open No. Hei 5-62469 of Patent Literature 5 proposes refresh based on an event signal of an internal access counter and refresh based on an event signal from a CPU processor.

However, these examples all suppose refresh during operation of the apparatus, and assume that at least the apparatus is under complete operation control of a CPU. Therefore, the examples do not suppose long-term data retention during nonuse of the apparatus. Even as for refresh at a time of turning on power, frequency of a user turning on the apparatus cannot be guaranteed nor be forced. This method is very unreliable from a viewpoint of data retention during nonuse of the apparatus, and therefore cannot ensure long-term data retention.

Furthermore, in a ferroelectric memory, the same data stored over a long period of time causes internal movable charge to be redistributed and fixed so as to cancel an internal electric field attendant on polarization, causing a shift or distortion of the hysteresis loop. This is referred to as an "imprint," which in a bad case causes erroneous reading or erroneous writing.

The hysteresis shift caused by the movable charge is corrected by inverting data. Thus, mainly to deal with this problem, the refresh operation described in Japanese Patent Laid-open No. 2000-11665 of Patent Literature 3 performs data reading, inverted writing, and normal writing on the basis of an external command. A refresh event described in the literature occurs when a predetermined time has passed since normal writing, when power to the apparatus is turned on, or when the power to the apparatus is stopped.

During nonuse of the apparatus in this case, however, data is left as it is over an indefinite long period of time, so that a degree of deterioration of an imprint cannot be guaranteed. That is, it is not possible to perfectly prevent the state of the imprint from deteriorating to such a degree as to cause erroneous reading. Further, in that case, data is no longer restored even when refresh is performed because the data is lost at the time of reading.

Further, the sequence described above requires writing after inverting bit line data once outputted to a sense amplifier, and then rewriting after inverting the inverted bit line data. This procedure is very complex and time-consuming. Besides, when bit lines having a heavy capacitive load are inverted in the whole array, erroneous operation tends to be caused by occurrence of noise or the like.

Of course, this example is similar to the above examples in that it cannot be a sufficient measure against data retention degradation.

SUMMARY OF THE INVENTION

It is an object of the present invention to realize reliable data retention over a long period of time in a high-speed nonvolatile memory, and provide an optimum control method therefor.

In order to achieve the object, according to the present invention, there is provided an information processing apparatus including: semiconductor memory means including nonvolatile memory cells; switch means for turning on and off power supplied for refresh operation of the semiconductor memory means during a nonuse period when main power to the apparatus is turned off; and refresh control means supplied with power at all times even during the nonuse period, for effecting control to turn on the switch means and performing the refresh operation of the nonvolatile memory cells during the nonuse period.

The refresh control means periodically effects control to turn on the switch means; specifies an address of a nonvolatile memory cell, and performs the refresh operation of the nonvolatile memory cell corresponding to the specified address; and effects control to turn off the switch means.

The switch means and the refresh control means are included within a memory chip including the semiconductor memory means.

According to the present invention, there is provided a semiconductor memory including a nonvolatile memory cell, and a signal generating unit for generating a signal to perform refresh operation of the memory cell corresponding to an address inputted to an address terminal in response to turning on of power to a power supply terminal.

According to the present invention, there is provided a semiconductor memory including: a nonvolatile memory cell; switch means for turning on and off power supplied for refresh operation of the nonvolatile memory cell; and refresh control means supplied with power even during an off period of the switch means, for effecting control to turn on the switch means and performing the refresh operation of the nonvolatile memory cell during the off period.

The refresh control means periodically effects control to turn on the switch means; specifies an address of the nonvolatile memory cell, and performs the refresh operation of the nonvolatile memory cell corresponding to the specified address; and effects control to turn off the switch means.

The semiconductor memory further includes: a first power supply terminal supplied with main power; a second power supply terminal supplied with backup power at all times; and power sensing means for monitoring a state of power supply from the first power supply terminal, and supplying the refresh control means with a performance control signal in response to a power supply voltage from the first power supply terminal becoming a predetermined value or lower. The switch means turns on and off power supplied from the second power supply terminal for the refresh operation of the nonvolatile memory cell, and the refresh control means effects control to turn on the switch means in response to the performance control signal supplied from the power sensing means and performs the refresh operation of the nonvolatile memory cell.

In the semiconductor memory according to the present invention, the nonvolatile memory cell is constructed with a ferroelectric capacitor using ferroelectric film as storing material, and storing two values or more by difference in polarization direction of the ferroelectric film; and at least at a time of the refresh operation, after operation of reading data from a memory cell group to be refreshed, data of "1" is written to the entire memory cell group, and then the data stored in the memory cell group is restored.

In the information processing apparatus or the semiconductor memory according to the present invention, the memory cell has one of a structure using ferroelectric film as storing material, and storing two values or more by difference in polarization direction of the ferroelectric film, a structure using magnetic film as storing material, and storing two values or more by difference in magnetization direction of the magnetic film, and a structure using chalcogenide film as storing material, and storing two values or more by difference in crystal state of the chalcogenide film.

The present invention forms the information processing apparatus and the semiconductor memory as described above. The present invention performs, as a basis, refresh operation during nonuse of the apparatus (or during standby of the memory) to ensure long-term data retention of the nonvolatile memory (high-speed nonvolatile memory).

The conventional nonvolatile memories as in the foregoing patent literature suppose that power to the memories is not turned on during the nonuse of the apparatus (or during the standby of the memories), including the cases where refresh (refresh during operation) is introduced. That is, the memories are assumed to ensure long-term data retention only by spontaneous stability of their storing materials during the nonuse of the apparatus (or during the standby of the memories). Japanese Patent Laid-open No. Hei 9-326200 of Patent Literature 2, for example, supposes retention of a polarization state of ferroelectric film, and the method is therefore ineffective for loss of the polarization state itself.

On the other hand, the present invention proposes a method of introducing refresh to a high-speed nonvolatile memory more actively. If long-term data retention were ensured only by the spontaneous stability of the storing material as described above, power consumption of the memory during nonuse of the apparatus could surely be reduced to zero. However, considering the applications of the memory as a substitute for DRAM in actual apparatus as described above, power consumption during standby of the memory needs only to be sufficiently low as compared with power consumption of the whole apparatus, and thus does not necessarily need to be zero.

Even if periodic refresh is performed during standby as in a DRAM, for example, a memory having the spontaneous data retention capability such as a ferroelectric memory or the like makes it possible to reduce frequency of the refresh by a few orders of magnitude. Further, power supply to the memory can be stopped at appropriate times during the nonuse, thereby preventing occurrence of so-called dark current, which is current consumed by only supplying current to the circuit.

Thus, a combination of the spontaneous data retaining capability of film, the periodic refresh, and intermittent power supply makes it possible to minimize power consumption at the time of standby and retain data reliably.

Further, in the semiconductor memory, the first power supply terminal and the second power supply terminal are provided, with the first power supply terminal connected to a main power supply of the information processing apparatus and the second power supply terminal connected to a backup power supply of the information processing apparatus. (The backup power supply is for example a secondary battery connected to a clock IC of the apparatus, and current supply from the backup power supply is continued even after the main power supply of the apparatus is turned off.)

In this case, at a time of normal use of the apparatus including access to the memory cell, current is supplied from the first power supply terminal (main power supply). When the main power supply is turned off at a time of nonuse of the apparatus, the power sensing means senses a decrease in supply potential of the first power supply terminal, whereby the semiconductor memory goes into a mode of refresh by the refresh control means. In the refresh mode, refresh is periodically performed within the memory chip using current supplied from the second power supply terminal. In such a refresh operation, the memory needs to consume only a minimum current for data retention, and a memory having the spontaneous data storing capability such as a ferroelectric memory or the like, in particular, makes it possible to reduce the current to a very low value, as described above. Therefore, data can be retained safely over a sufficiently long period of time even with the backup power supply, which has a capacity much lower than that of the main power supply.

In the case of the ferroelectric memory cell, in particular, at a time of refresh, inverted data is first written after reading, and then normal data is written. Alternatively, in order to simplify the sequence and stabilize the operation, preferably "1" is first written after reading, and then "0" is selectively written to restore data. This is effective in preventing erroneous operation due to an imprint.

When the refresh control means is included in a chip as the semiconductor memory, a ferroelectric capacitor produced in the same process as the memory cell is preferably included in an RC delay circuit for generating a clock of the refresh control means.

BRIEF DESCRIPTION OF THE DRAWINGS

These and other objects of the invention will be seen by reference to the description, taken in connection with the accompanying drawing, in which:

FIG. 12A is a timing chart of a refresh sequence of the fourth embodiment; and

FIG. 12B is a diagram of assistance in explaining the refresh sequence, showing a part of configuration of a memory array.

DETAILED DESCRIPTION OF THE PREFERRED EMBODIMENTS

A first to a fourth embodiment of the present invention will hereinafter be described, and thereafter a refresh sequence suitable for the embodiments will be described.

<First Embodiment>

Figure 3:
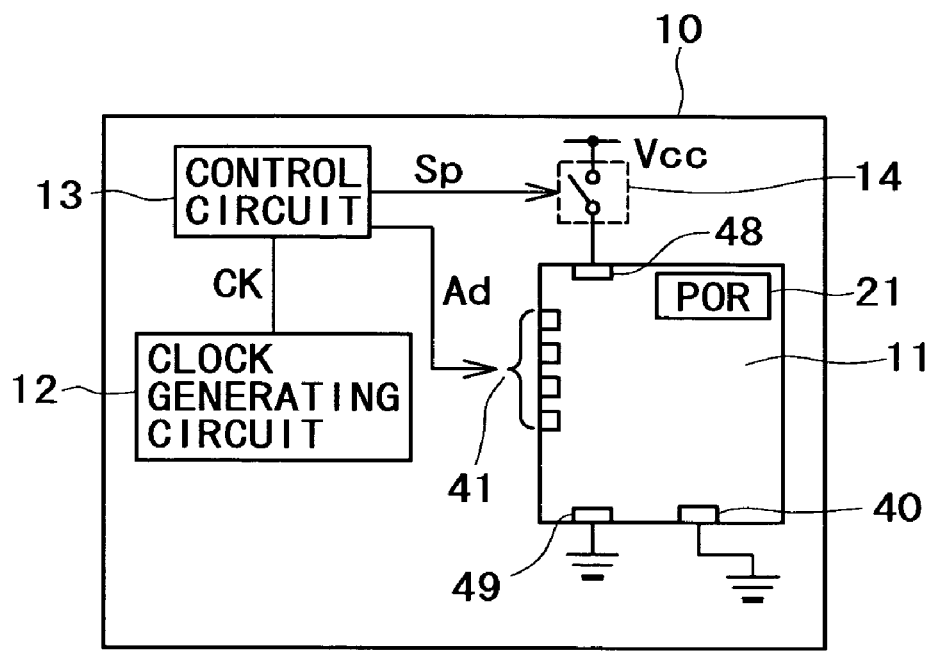
FIG. 3 is a block diagram of a first embodiment of the present invention.

FIG. 3 shows a configuration of main parts of a first embodiment. FIG. 3 shows a memory chip 11 included in a computer apparatus (information processing apparatus) 10, and particularly shows a memory control configuration at a time of nonuse in the computer apparatus 10.

The time of nonuse of the apparatus specifically supposes that while a power supply switch of a user interface is turned off and the user does not communicate with the apparatus, the apparatus itself can be supplied with power as required via an internal battery or an adaptor to an external power supply.

Figure 1:
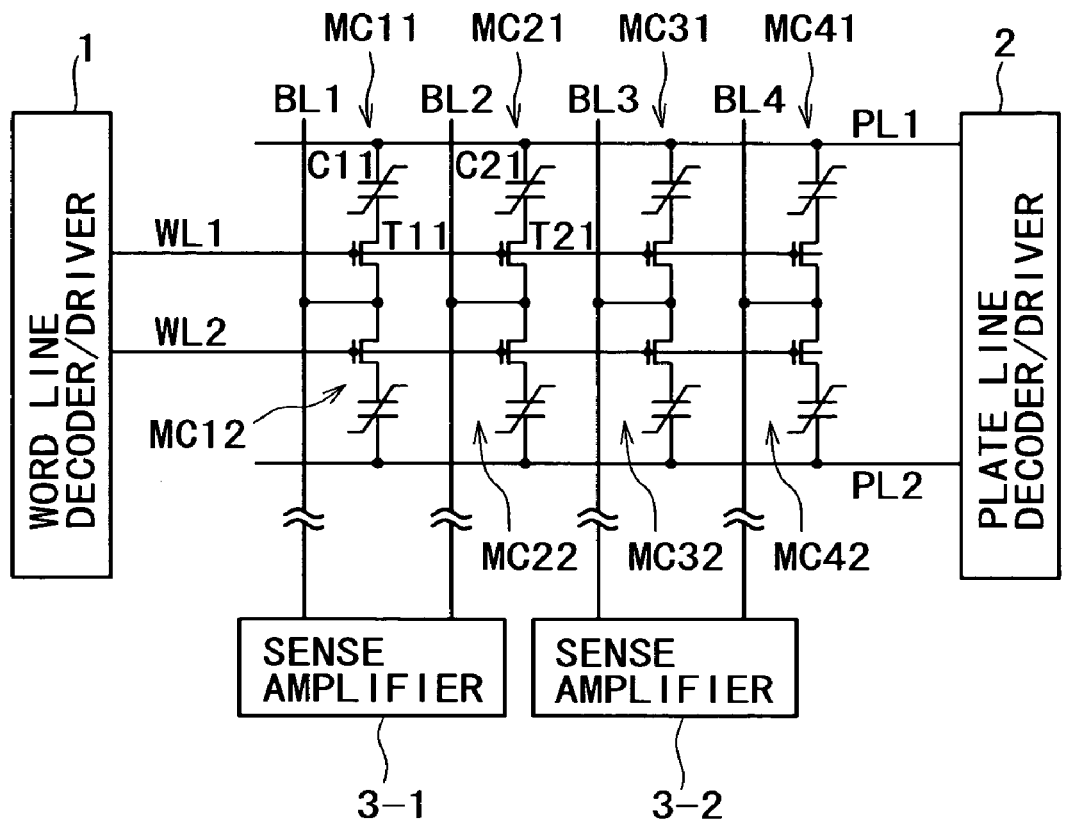
FIG. 1 is a diagram of assistance in explaining a cell structure of a ferroelectric memory.

The memory chip 11 in this example includes a memory cell array as a ferroelectric memory and a circuit system for driving the memory cell array (a word line decoder/driver, a sense amplifier, a plate line decoder/driver, and the like) as described with reference to FIG. 1, for example.

The memory chip 11 is supplied with operating power from a power supply terminal 48. A ground terminal 49 is grounded.

In this case, a switch 14 is set in an on state at the time of nonuse of the apparatus to thereby supply an operating voltage Vcc to the power supply terminal 48 of the memory chip 11. That is, the switch 14 turns on/off the operating power to the memory chip 11 at the time of nonuse.

Incidentally, while a system for supplying power to the memory chip 11 at a time of operation of the apparatus is not shown, a power supply path including the switch 14 may be used also as a power supply path at the time of normal operation.

A clock generating circuit 12 is for example a commercial clock element for a clock using a crystal oscillator, for example. The clock generating circuit 12 generates a 32-KHz clock signal CK.

A control circuit 13 is for use at the time of standby of the memory chip 11. The control circuit 13 obtains the clock signal CK from the clock generating circuit 12, and operates as a timer to periodically send a pulse signal (a power-on pulse Sp) to the switch 14 and supply an address signal Ad for refresh to the memory chip 11.

The switch 14 is turned on by the power-on pulse Sp from the control circuit 13 to thereby supply the operating voltage Vcc to the memory chip 11.

During nonuse of the computer apparatus 10, the power-on pulse Sp is periodically supplied from the control circuit 13 (a signal value of the power-on pulse Sp is periodically changed from an "L" to an "H"). Thereby power to the memory chip 11 is periodically turned on via the switch 14.

A power-on refresh signal generating circuit 21 functions when the power to the memory chip 11 formed by a ferroelectric memory is turned on. The power-on refresh signal generating circuit 21 determines a state of a power-on refresh terminal 40. When the power-on refresh terminal 40 is in an "L" state, the power-on refresh signal generating circuit 21 selects a memory cell row corresponding to a ROW address signal Ad inputted to an address terminal 41, and performs reading to a sense amplifier and rewriting, or so-called refresh.

After passage of a certain time, the power-on pulse Sp falls from the "H" to the "L" and correspondingly the switch 14 is turned off to stop supply of the power to the memory chip 11.

Figure 4:
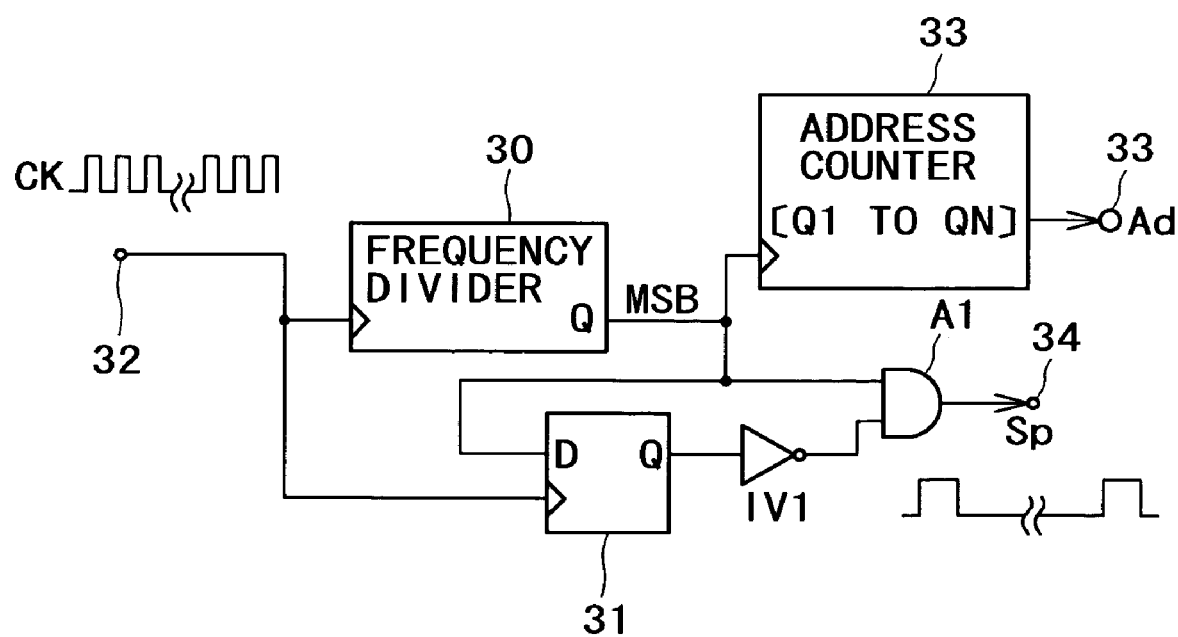
FIG. 4 is a block diagram of a control circuit of the first embodiment.

FIG. 4 shows a circuit example of the control circuit 13.

A 16-bit counter frequency divider 30 divides frequency of the 32-KHz clock signal CK inputted from the clock generating circuit 12 to a terminal 32 of the control circuit 13, and outputs a value of its most significant bit (MSB signal).

The MSB signal is supplied to a D input terminal of a D flip-flop 31 and an AND gate A1. The D flip-flop 31 latches the D input on the basis of the clock signal CK, and sets the D input as an output Q. The Q output of the D flip-flop 31 is inverted by an inverter IV1, and then supplied to the AND gate A1.

Thereby a logical product output of the AND gate A1 is a 30-µs pulse generated at intervals of two seconds. The pulse is outputted to a terminal 34. The output pulse of the terminal 34 is the power-on pulse Sp that controls the switch 14 as described above.

A value of an address counter 33 is incremented by one simultaneously with the generation of this pulse, and outputted to a terminal 33. The output of the terminal 33 is supplied as the ROW address signal Ad for refresh to the address terminal 41 of the memory chip 11.

Figure 5:
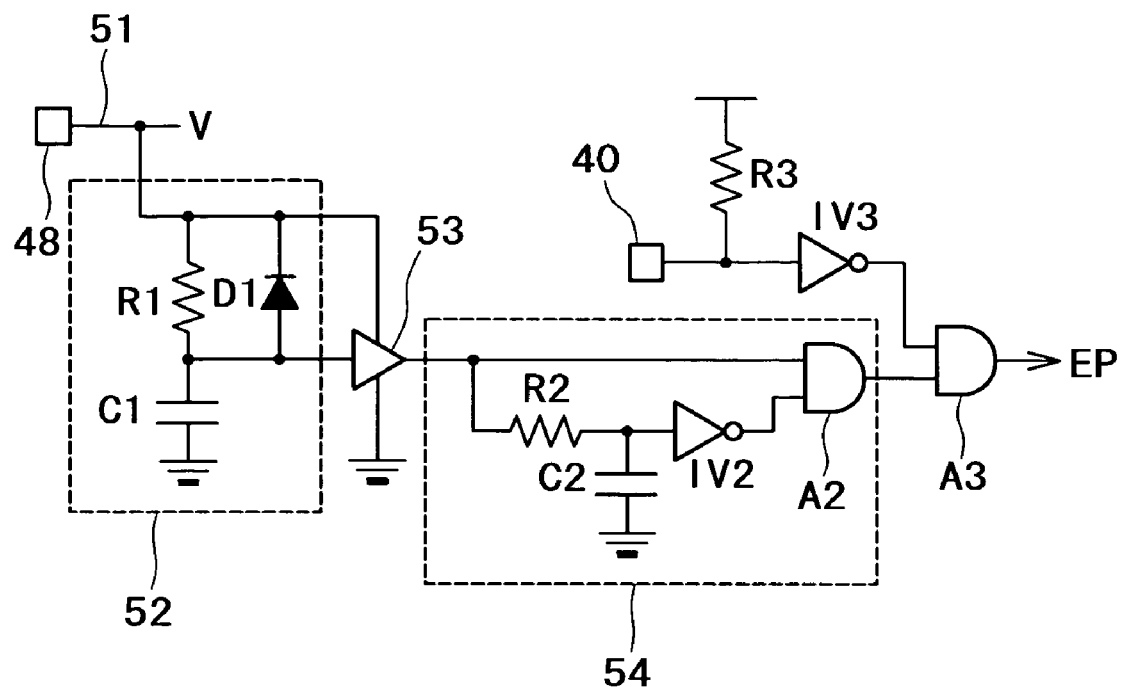
FIG. 5 is a circuit diagram of a power-on refresh signal generating circuit of the first embodiment.

FIG. 5 shows a circuit example of the power-on refresh signal generating circuit 21 in the memory chip 11.

The power supply terminal 48 supplied with the operating power via the switch 14 is connected with a voltage detector 53 via an RC delay circuit 52.

The RC delay circuit 52 includes a resistance R1, a capacitor C1, and a diode D1. The RC delay circuit 52 provides an RC delay at the time of turning on the power to the power supply terminal 48, that is, activation of a power supply line 51, and then inputs a power supply voltage to the voltage detector 53.

When the voltage inputted to the voltage detector 53 reaches a certain value, a pulse converting circuit 54 converts a rising edge of an output of the voltage detector 53 into a one-shot pulse, and then outputs the one-shot pulse to an AND gate A3. The pulse converting circuit 54 is formed by connecting a resistance R2, a capacitor C2, an inverter IV2, and an AND gate A2 in a manner as shown in FIG. 5. Thus, the inverter IV2 supplies an "H" signal for a period determined by a time constant circuit of the resistance R2 and the capacitor C2. The AND gate A2 obtains a logical product of this signal and the output of the voltage detector 53. Consequently, an output of the AND gate A2 is the one-shot pulse corresponding to the rising edge. The output of the AND gate A2 is supplied to the AND gate A3.

Another input of the AND gate A3 is supplied with a signal from a circuit including the power-on refresh terminal 40, a resistance R3, and an inverter IV3. Thus, an "H" level signal is inputted to the AND gate A3 when the power-on refresh terminal 40 is at an "L" level.

A logical product output of the AND gate A3 is an event pulse EP for starting refresh in the memory chip 11.

That is, only in the case where the power-on refresh terminal 40 is at the "L" level, the event pulse EP for starting refresh is outputted from the power-on refresh signal generating circuit 21 at the time of turning on the power to the power supply terminal 48.

In response to the event pulse EP thus generated, refresh operation is performed on a memory row indicated by the ROW address signal Ad inputted to the address terminal 41 within the memory chip 11.

The refresh operation on a memory cell as a ferroelectric memory within the memory chip 11 is substantially the same as the reading operation described above with reference to FIG. 1, for example.

Specifically, taking as an example the capacitors C11 and C21 in FIG. 1, the refresh operation is as follows.

In an initial state, the plate line PL1 and the bit line pair BL1 and BL2 are equalized to 0V, and the bit lines BL1 and BL2 are in a floating state. The capacitors C11 and C21 forming a pair are polarized in directions opposite to each other.

A pulse of the voltage Vcc is applied to the plate line PL1, whereby substantially Vcc is applied to both the capacitors C11 and C21. Accordingly, a signal difference corresponding to a difference in amount of polarization change from the initial state occurs between the bit lines BL1 and BL2.

For example, of the capacitors C11 and C21, only the capacitor C21 causes polarization inversion, and a signal difference corresponding to the inversion appears between the bit lines BL1 and BL2. The signal difference is sensed by the differential sense amplifier 3-1, whereby data is obtained.

Further, the sense amplifier 3-1 is activated to amplify the voltage of the bit line BL1 to 0 V and the voltage of the bit line BL2 to the voltage Vcc.

Next, the plate line PL1 is driven to 0 V again, whereby the voltages applied to the capacitors C11 and C21 are changed to zero and (–Vcc), respectively.

Finally, when the bit lines BL1 and BL2 are returned to 0 V, the capacitors C11 and C21 are restored to the respective original states of polarization. That is, refresh is performed.

Such refresh operation is performed on the memory row indicated by the ROW address signal Ad inputted to the address terminal 41.

Unlike normal data reading, the refresh operation does not require transfer of the data of the sense amplifier 3 to an output terminal of the memory chip 11. Thus, corresponding circuit operation can be omitted, and the refresh operation consumes lower power than the normal reading operation.

In the first embodiment as described above, the memory chip 11 performs refresh for only one-ROW addresses in response to the event pulse EP interlocked with the turning on of power via the switch 14.

This lowers peak current by averaging current consumption, and is effective means particularly in obtaining stable operation in a battery backup apparatus.

Also, since operation of one cycle is completed in a short time, even if external power is stopped due to some accident during refresh, unexpected data destruction can be prevented by completing the cycle while internal power is retained by the capacitor. Thus, this means can be said to be most suitable for the present invention, in which periodic refresh is performed while the apparatus is not used.

Such refreshing of memory cells as a high-speed nonvolatile memory having the spontaneous data storing capability at the time of nonuse realizes reliable data retention.

Further, even though periodic refresh is performed during standby as in a DRAM, frequency of the refresh can be reduced by a few orders of magnitude.

Further, as described above, current is supplied to the memory chip 11 only when the refresh operation is performed, and the switch 14 is turned off again immediately after the refresh operation. Therefore, power consumption involved in refresh processing at the time of nonuse can be reduced as much as possible. In addition, stopping power supply to the memory chip 11 at times of other than the refresh operation prevents occurrence of so-called dark current, which is current consumed by only supplying power to the circuit.

Thus, it is possible to retain the data of memory cells reliably while keeping power consumption during standby as low as possible. Thereby a memory system can be realized that can retain data reliably with minimum power consumption and enable high-speed access. In addition, the need for providing a large margin for data retention degradation to a cell signal as in a common high-speed nonvolatile memory is eliminated. It is thus possible to miniaturize the memory cells and reduce bit cost.

Incidentally, in the configuration in the above example, an address counter may be provided within the memory chip 11 to scan all ROW addresses at a stroke and refresh the whole chip on turning on the power. In this case, there is an advantage in that the address signal Ad for refresh does not need to be inputted from the control circuit 13 external to the memory chip 11.

<Second Embodiment>

When the control circuit 13 shown in FIG. 4 in the first embodiment is included in the memory chip 11, the memory as a device is very easy to handle. The configuration in that case is shown as a second embodiment in FIG. 6.

It suffices for a computer apparatus 10 only to send a clock signal CK from a clock generating circuit 12 to a clock input terminal 43 of a memory chip 11b at a time of nonuse.

The memory chip 11b is supplied with operating power Vcc at a power supply terminal 48. Control for turning on/off the operating power Vcc for refresh operation is effected by an internal control circuit 13b.

Specifically, when an auto-refresh terminal 42 is at an "L" level, the control circuit 13b internally generates an event at appropriate times from the supplied clock signal CK, and automatically performs refresh. Thus, the refresh is similar to auto-refresh of DRAM, which apparatus designers are accustomed to using. Furthermore, the power consumption is far less than that of the DRAM.

Figure 7:
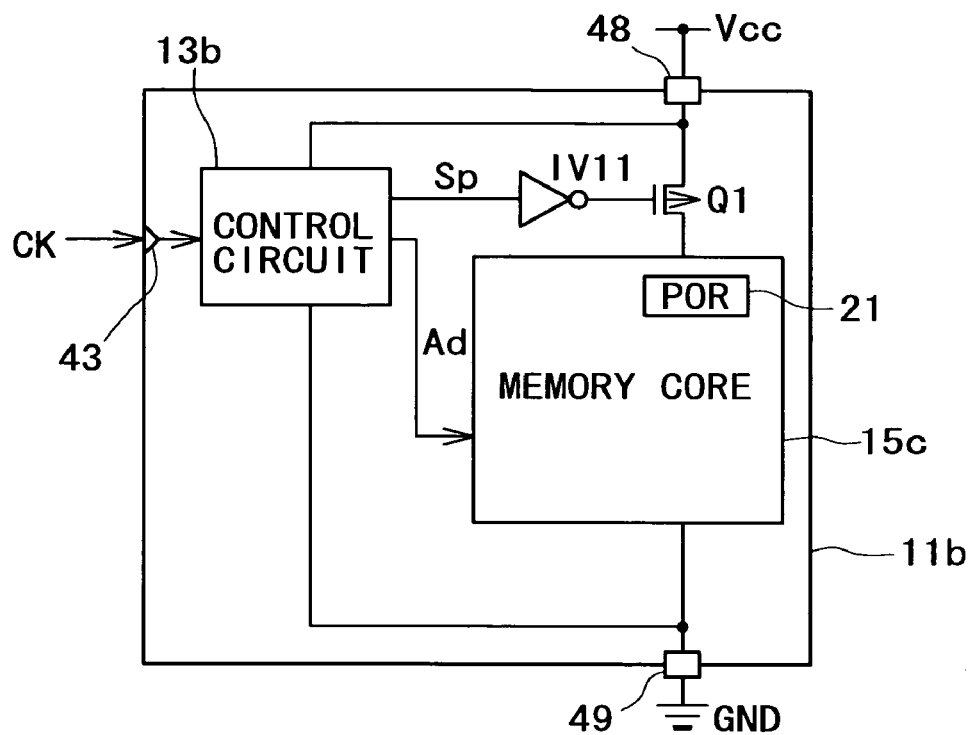
FIG. 7 is a block diagram of configuration of a memory chip according to the second embodiment.

FIG. 7 shows an example of circuit connection during standby of the memory chip 11b.

The control circuit 13b within the memory chip 11b is supplied with current from the power supply terminal 48 at all times during standby. The control circuit 13b is configured in a manner similar to that of FIG. 4.

The control circuit 13b receives the external clock signal CK from the clock input terminal 43, outputs a power-on pulse Sp, and outputs an address signal Ad for refresh as described with reference to FIG. 4.

In addition, an inverter IV11 and a switch Q1 formed by a FET (P-channel MOS transistor) are provided within the memory chip 11b. The switch Q1 is formed on a power supply path for supplying operating power from the power supply terminal 48 to a memory core 15c during standby of the memory chip 11b.

The power-on pulse Sp is inputted from the control circuit 13b to a gate of the switch Q1 after being inverted by the inverter IV11. Thus, the switch Q1 is turned on in response to the power-on pulse Sp to supply operating power to the memory core 15c.

The memory core 15c having a memory cell array formed by a ferroelectric memory includes therewithin the power-on refresh signal generating circuit 21 as described with reference to FIG. 5.

Thus, when the switch Q1 is turned on and power is supplied to the memory core 15c the power-on refresh signal generating circuit 21 generates an event pulse EP for starting refresh. In response to the event pulse EP, a refresh operation corresponding to the ROW address signal Ad from the control circuit 13b is performed.

The second embodiment provides similar effects to those of the first embodiment. Further, the second embodiment is easy to use because the refresh of the memory chip 11b can be handled in a manner similar to the auto-refresh of DRAM.

<Third Embodiment>

Figure 6:
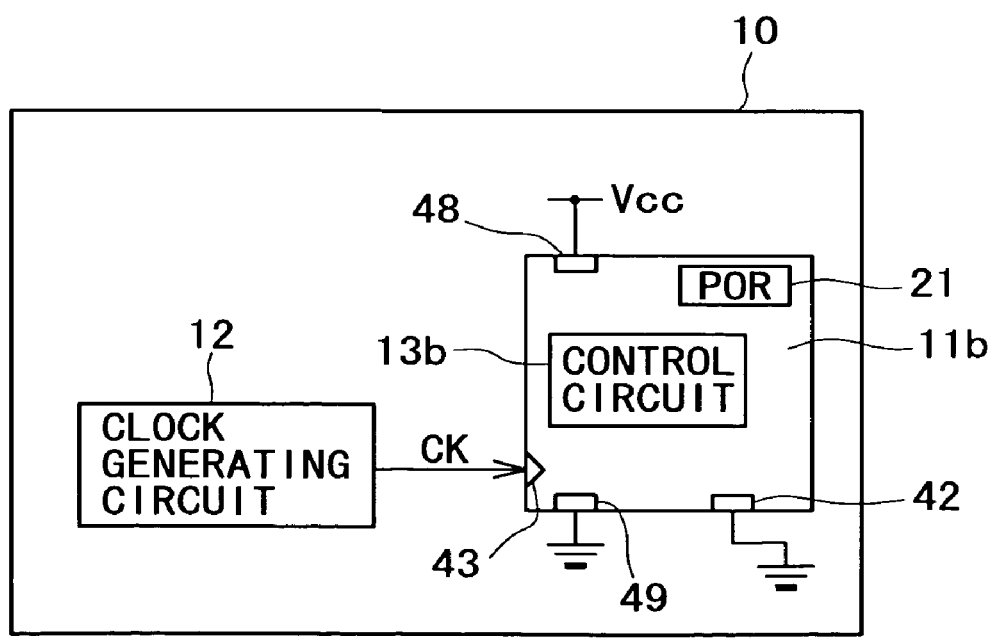
FIG. 6 is a block diagram of a second embodiment of the present invention.

A third embodiment incorporates also the clock generating circuit 12 as shown in FIG. 6 in the second embodiment into a memory chip.

In this case, a ring oscillator and a frequency divider are used as the clock generating circuit, and are included in the memory chip.

Figure 8:
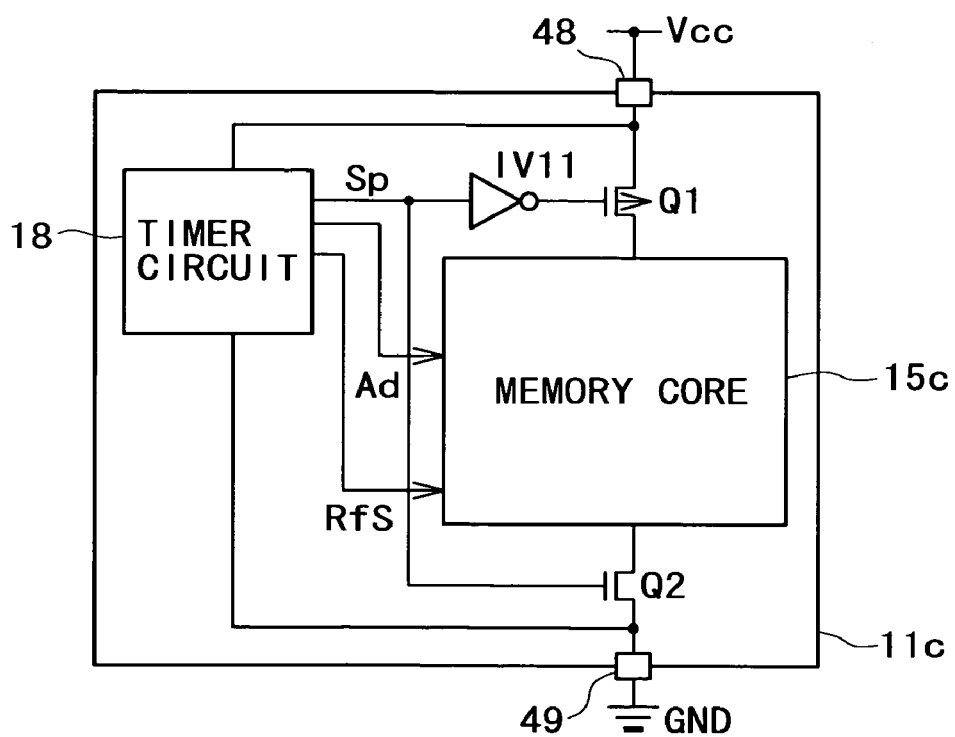
FIG. 8 is a block diagram of a third embodiment of the present invention.

FIG. 8 shows an example of circuit connection during standby of the memory chip 11c of the third embodiment.

The memory chip 11c has a power supply terminal 48 supplied with operating power Vcc.

A timer circuit 18 disposed within the memory chip 11c has functions of both the clock generating circuit 12 and the control circuit 13 in the first embodiment (FIGS. 3 to 5). The timer circuit 18 is supplied with current from the power supply terminal 48 at all times during standby. The timer circuit 18 is connected to a ground at all times by a ground terminal 49. The timer circuit 18 is thus operable during standby.

The timer circuit 18 outputs a power-on pulse Sp for periodic on/off control of power to a memory core 15c during standby. The timer circuit 18 also outputs an address signal Ad from an internal counter. The timer circuit 18 further supplies a refresh start timing signal RfS for the memory core 15c at appropriate times.

In addition, an inverter IV11 and a switch Q1 formed by a FET (P-channel MOS transistor) are provided within the memory chip 11c. The switch Q1 is formed on a power supply path for supplying the operating power from the power supply terminal 48 to the memory core 15c during standby of the memory chip 11c.

The power-on pulse Sp is inputted from the timer circuit 18 to a gate of the switch Q1 after being inverted by the inverter IV11. Thus, the switch Q1 is turned on in response to the power-on pulse Sp to supply the operating power to the memory core 15c.

The memory core 15c having a memory cell array formed by a ferroelectric memory performs a refresh operation corresponding to the ROW address signal Ad from the timer circuit 18 when the refresh start timing signal RfS is inputted from the timer circuit 18 after the switch Q1 is turned on and power is supplied to the memory core 15c.

After the refresh operation, the switch Q1 is turned off at a falling edge of the power-on pulse Sp from the timer circuit 18, whereby the supply of the operating power to the memory core 15c is interrupted.

A switch Q2 formed by an N-channel MOS transistor is further provided within the memory chip 11c. The switch Q2 turns on/off connection between the memory core 15c and the ground GND. The power-on pulse Sp is inputted from the timer circuit 18 to a gate of the switch Q2. Thus, in response to the power-on pulse Sp, the switch Q2 is turned on to connect the memory core 15c to a ground line.

That is, the switch Q2 connects the memory core 15c to the ground line only while the switch Q1 is turned on to supply the operating power to the memory core 15c for refresh operation.

Figure 9:
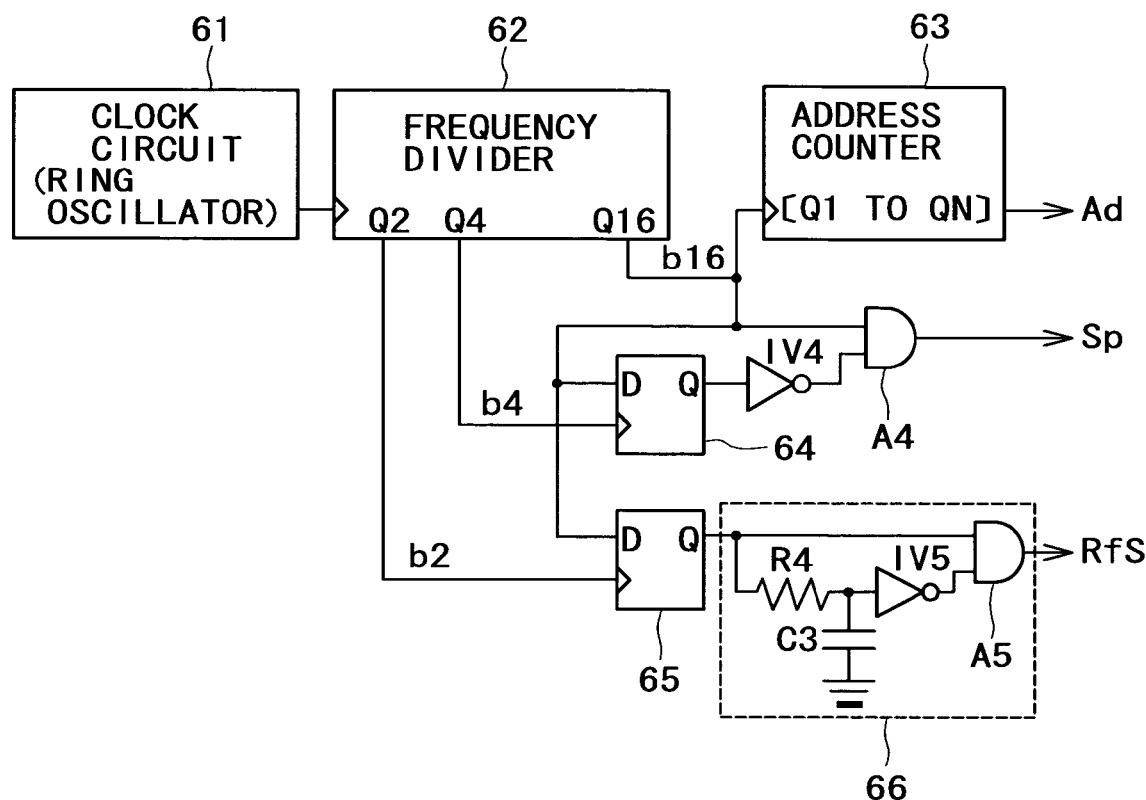
FIG. 9 is a block diagram of a timer circuit of the third embodiment.

FIG. 9 shows an example of configuration of the timer circuit 18.

A clock circuit 61 is formed by using a ring oscillator. A 16-bit counter frequency divider 62 divides frequency of an output of the clock circuit 61.

A rising edge of a most significant bit output b16 of the frequency divider 62 is used to generate timing for turning on power, to increment a ROW address counter 63, and to generate a rising edge of the power-on pulse Sp.

A second bit output b2 of the frequency divider 62 is inputted as a clock for a D flip-flop 65 to generate the refresh start timing signal RfS in response to a D input at an "H" level.

Then, a fourth bit output b4 of the frequency divider 62 is inputted as a clock for a D flip-flop 64, and is used to generate a falling edge of the power-on pulse Sp.

Specifically, an output of the ROW address counter 63 incremented by the output b16 is supplied as the ROW address signal Ad to the memory core 15c.

The power-on pulse Sp is generated when a logical product of an AND gate A4 is "H" at a time of the output b16 being "H." The output b16 is also used as a D input of the D flip-flop 64. After the output b16 becomes "H," the "H" level of the output b16 is latched in timing in which the output b4 becomes "H." The output latched by the D flip-flop 64 is inputted to the AND gate A4 after being inverted by an inverter IV4. Therefore, at that time, an output of the AND gate A4 becomes "L," that is, the falling edge of the power-on pulse Sp is generated.

As for the refresh start timing signal RfS, the D flip-flop 65 first latches the "H" state of the output b16 in timing of the output b2. A rising edge of the latched output is converted into a one-shot pulse by a pulse converting circuit 66, and then outputted as the refresh start timing signal RfS.

The pulse converting circuit 66 is formed by connecting a resistance R4, a capacitor C3, an inverter IV5, and an AND gate A5 in a manner as shown in FIG. 9. Thus, the inverter IV5 supplies an "H" signal for a period determined by a time constant circuit of the resistance R4 and the capacitor C3. The AND gate A5 obtains a logical product of this signal and the latched output of the D flip-flop 65. Consequently, an output of the AND gate A5 is the one-shot pulse corresponding to the rising edge of the latched output of the D flip-flop 65, that is, the refresh start timing signal RfS.

The third embodiment is formed as described above.

In the first and second embodiments, the control circuit 13 or 13b first turns on power to the memory chip 11 or the memory core 15, and the power-on refresh signal generating circuit 21 within the memory chip generates a refresh event pulse EP in such a manner as to be interlocked with the turning on of the power. On the other hand, the third embodiment generates a refresh event start signal as the refresh start timing signal RfS directly from the timer circuit 18.

Such an embodiment can provide similar effects to those of the foregoing first embodiment. In addition, in this case, data can be retained with very low power consumption simply by supplying current to the memory chip 11c, and there is no need to send a clock externally. Further, since clock wiring on a printed board or the like of the apparatus is not required, current consumption attendant on its charge and discharge can be reduced.

Further, in this example, not only the power Vcc is interrupted at appropriate times by the switch Q1 formed by a P-channel MOS transistor, but also the ground is disconnected simultaneously by the switch Q2 formed by an N-channel MOS transistor.

Thus, part of a charge within the memory core 15c is stored to be reused at a next time of turning on power. Therefore, the third embodiment can further reduce current consumption as compared with the first and second embodiments, which interrupt only the power.

In the case of generating the event pulse EP interlocked with the turning on of power by the power-on refresh signal generating circuit 21 as shown in FIG. 5 as in the first embodiment, ground disconnection can cause a malfunction.

In this example, however, since the refresh start timing signal RfS corresponding to the event pulse EP is supplied from the timer circuit 18, the memory core 15c can be disconnected from the ground without a problem.

Specifically, the timer circuit 18 first generates the power-on pulse Sp to connect the power and the ground to the memory core 15c. After passage of a predetermined time, the timer circuit 18 next sends the refresh start timing signal RfS to instruct the memory core 15c to start refresh. Then, after passage of a sufficient time for refresh operation, the power-on pulse Sp is returned to an "L" state to disconnect the power and the ground from the memory core 15c.

That is, the timer circuit 18 as a control unit having a function of generating the power-on pulse Sp and the refresh start pulse (refresh start timing signal RfS) separately is included in the memory chip 11c, and is supplied with current at all times during standby. It is thereby possible to disconnect the memory core 15c from the ground, and hence further reduce current consumption of the memory core 15c.

Since a high-speed nonvolatile memory such as a ferroelectric memory or the like has the spontaneous data retaining capability, a refresh cycle of the high-speed nonvolatile memory is desired to be sufficiently long for reduced power consumption. On the other hand, when the clock generating circuit 61 is included in the memory chip 11c as in the third embodiment, an oscillation cycle of the ring oscillator serving as a clock generating source needs to be long in order to realize a long refresh cycle while keeping a scale of the frequency divider small.

To lengthen the cycle of the ring oscillator with a small circuit scale requires a long RC delay. However, in the case of a ferroelectric memory as in FIG. 1, a long delay can be readily obtained when a ferroelectric capacitor as used in a memory cell MC is included in the delay circuit.

Figure 10:
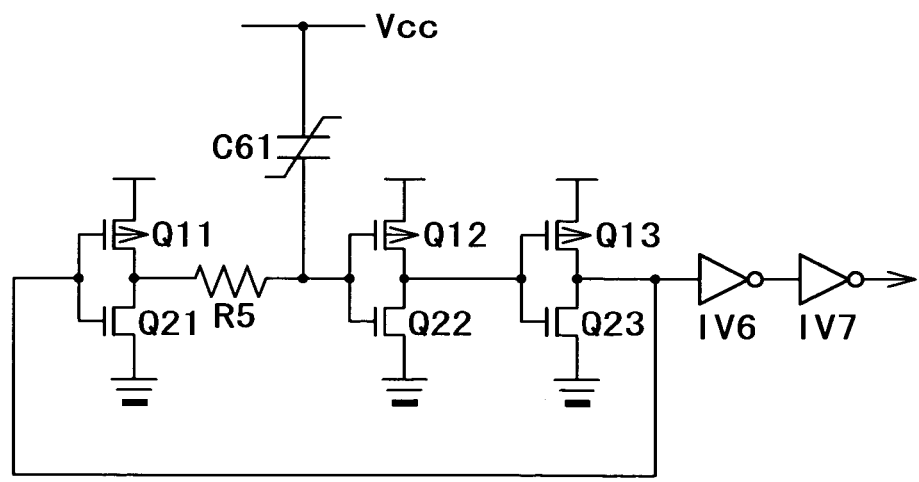
FIG. 10 is a circuit diagram of a clock circuit of the third embodiment.

FIG. 10 shows an example of the circuit.

The clock circuit 61 is formed by connecting a capacitor C61, a resistance R5, P-channel MOS transistors Q11, Q12, and Q13, N-channel MOS transistors Q21, Q22, and Q23, and inverters IV6 and IV7 in a manner as shown in FIG. 10.

The capacitor C61 in this case is a ferroelectric capacitor, and is manufactured by the same process as a capacitor of a memory cell MC in the memory core 15c. Since voltage applied to the capacitor C61 is limited to a range of 0 V to Vcc, operation of the capacitor C61 does not involve polarization inversion. Therefore, the capacitor C61 has stable capacitance, and with a small capacitor size, provides a value greater by one order of magnitude or more than a normal MOS capacitor. The capacitor C61 also has an advantage of being free from degradation in characteristics due to fatigue.

<Fourth Embodiment>

Figure 11:
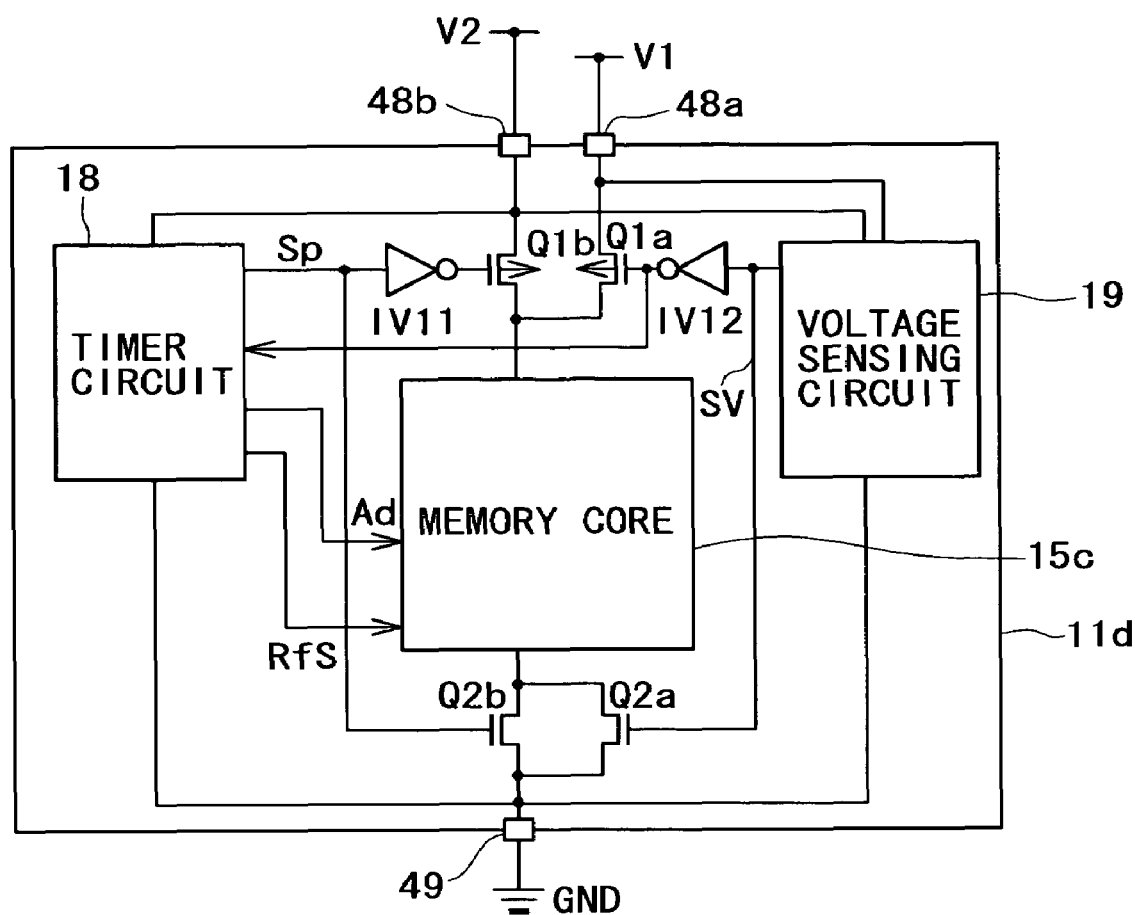
FIG. 11 is a block diagram of a fourth embodiment of the present invention.

FIG. 11 shows a configuration of a memory chip 11d according to a fourth embodiment.

The memory chip 11d in this case has a first power supply terminal 48a and a second power supply terminal 48b.

The power supply terminal 48a is connected to a main power supply V1 of a computer apparatus including the memory chip 11d. The power supply is stopped at a time of nonuse of the apparatus. On the other hand, the power supply terminal 48b is connected to a power supply V2 formed by a backup battery of the apparatus. The power supply V2 supplies power at all times irrespective of whether or not the apparatus is being used.

A memory core 15c has a memory cell array as in the third embodiment, for example.

A current for driving the memory core 15c is supplied from the power supply terminal 48a via a switch Q1a at a normal time of use of the apparatus involving memory access. At this time, the memory core 15c is connected to a ground GND via a switch Q2a.

At the time of nonuse of the apparatus, that is, while the supply of the main power V1 is stopped, power for refresh operation is supplied from the power supply terminal 48b to the memory core 15c via a switch Q1b. At this time, the memory core 15c is connected to the ground GND via a switch Q2b.

The switches Q1a and Q1b are P-channel MOS transistors, and the switches Q2a and Q2b are N-channel MOS transistors.

A timer circuit 18 obtains operating power by the backup power V2 from the power supply terminal 48b. The timer circuit 18 is connected to the ground at all times by a ground terminal 49. The timer circuit 18 is thus operable also during a period when the supply of the main power V1 is stopped.

The timer circuit 18 outputs a power-on pulse Sp for periodic on/off control of power to the memory core 15c at the time of nonuse of the apparatus. The power-on pulse Sp is supplied to a gate of the switch Q1b via an inverter IV11. The power-on pulse Sp is also supplied to a gate of the switch Q2b.

The timer circuit 18 also outputs an address signal Ad from an internal counter to the memory core 15c. After turning on power to the memory core 15c, the timer circuit 18 further outputs a refresh start timing signal RfS as a pulse for starting refresh.

Thus, the timer circuit 18 in this case has the same functions as the timer circuit 18 of the third embodiment.

A voltage sensing circuit 19 monitors a state of supply of the main power V1.

The voltage sensing circuit 19 obtains operating power by the backup power V2 from the power supply terminal 48b. The voltage sensing circuit 19 is connected to the ground at all times by the ground terminal 49. The voltage sensing circuit 19 is thus operable also during a period when the supply of the main power V1 is stopped.

The voltage sensing circuit 19 senses voltage of the main power V1 supplied from the power supply terminal 48a, and outputs a control signal SV corresponding to the voltage.

For example, during a period when the main power to the apparatus is turned on, that is, a period when the power supply voltage of the power supply terminal 48a is at a certain value or higher, the voltage sensing circuit 19 maintains the control signal SV at an "H" level. In this case, since the control signal SV is supplied to a gate of the switch Q1a via an inverter IV12, the switch Q1a is turned on to supply the main power V1 to the memory core 15c. Since the switch Q2a is also turned on by the control signal SV at the "H" level, the memory core 15c is connected to the ground.

When the main power to the apparatus is turned off and the power supply voltage of the power supply terminal 48a becomes lower than the certain value, the voltage sensing circuit 19 changes the control signal SV from the "H" to an "L." Accordingly the switches Q1a and Q2a are turned off, and thus current supply from the power supply terminal 48a to the memory core 15c is stopped.

The control signal SV is also supplied to the timer circuit 18. The timer circuit 18 is configured to start operation by detecting the falling of the control signal SV from an "H" to an "L."

Specifically, when the timer circuit 18 starts operation on the basis of the control signal SV at the time of turning off the main power V1, the timer circuit 18 turns on the switches Q1b and Q2b by the power-on pulse Sp as described above, and thereby connects the memory core 15c to the power supply terminal 48b for supplying the backup power V2. That is, the memory core 15c is supplied with the power and connected to the ground.

After passage of a predetermined time, the timer circuit 18 next sends the refresh start timing signal RfS and the address signal Ad to the memory core 15c. The memory core 15c selects a memory cell group specified by the address signal Ad to refresh the memory cell group.

Then, after passage of a sufficient time for refresh operation, the timer circuit 18 returns the power-on pulse Sp to an "L" state to disconnect the power and the ground from the memory core 15c.

Thus, the timer circuit 18 periodically supplies the power and sends a refresh event to the memory core 15c while incrementing an address Ad. Thereby data stored in the memory core 15c remains retained safely.

When the main power to the apparatus is turned on again and thus the power supply terminal 48a is supplied with the main power V1, the voltage sensing circuit 19 detects the potential increase, and then changes the control signal SV from the "L" to the "H."

Thereby the timer circuit 18 stops operation. The switches Q1a and Q2a are turned on to resume current supply from the power supply terminal 48a to the memory core 15c.

In the fourth embodiment, while the main power to the apparatus is turned off, all of the current for refresh operation is supplied by the power V2 of the backup battery from the power supply terminal 48b. That is, when the supply of the main power V1 from the power supply terminal 48a is stopped and its potential decreases, the memory chip 11d automatically performs refresh periodically using current supply from the backup power V2, thereby retaining memory data. On the other hand, in memory access with a high current consumption, the current is supplied from the main power supply V1, and thus the backup power is not consumed.

When such a memory chip 11d is included in a computer apparatus, it suffices for an apparatus designer, for example, to connect a secondary battery for a timer clock of the apparatus to the power supply terminal 48b so as to be shared with the timer clock, and connect a main power supply of the apparatus to the power supply terminal 48a as in ordinary apparatus. Otherwise no addition is required to conventional apparatus design.

When a memory device having spontaneous data retaining capability such as a ferroelectric memory or the like is used as the memory core, current required for data retention such as refresh can be minimized, and thus data can be retained safely over a sufficiently long period of time with only a low-capacity backup secondary battery. It is thus possible to greatly improve reliability of the memory without change in cost and a number of man-hours for design.

<Memory Cell Structure in Embodiments>

It is assumed in the foregoing first, second, third, and fourth embodiments that a ferroelectric memory is used for memory. Since normal access to the ferroelectric memory involves refresh operation, the functions as described above are realized particularly easily.

Basically, however, a memory allowing reading and writing at high speed with low voltage requires very low power consumption for refresh, and therefore will not deteriorate power consumption of the apparatus when refresh is performed at low frequency. In addition, such a memory has the same problem in that it is difficult to store data over a long period of time because of a low energy barrier between states, even though the memory has spontaneous retention capability.

Therefore, the configurations of the foregoing embodiments are applicable to memory chips having a memory cell array as another high-speed nonvolatile memory, for example MRAM, which stores data by direction of magnetization of magnetic film, or OUM, which stores data by crystal state of chalcogenide film, and introduction of the configurations of the foregoing embodiments is effective.

<Sequence for Preventing Malfunction Caused by Imprint>

As described in the foregoing Patent Literature 3 (Japanese Patent Laid-open No. 2000-11665), an imprint state of a ferroelectric memory is corrected by temporarily writing inverted data to memory cells in refresh operation.

The present invention can similarly prevent an imprint by introducing inverted data writing to periodic refresh at the time of nonuse of the apparatus.

In addition, when the above method is used in the periodic refresh of the present invention, the imprint state is periodically corrected without fail, and data is not left as it is over an indefinite long period of time, unlike the foregoing Patent Literature 3. Therefore, a malfunction due to an imprint can be surely avoided.

In the following, an operation for not only simply preventing a malfunction due to an imprint but also correcting the imprint with lower power consumption will be described as a method applicable to the embodiments of the present invention. The operation is based on the following principles.

Figure 2:
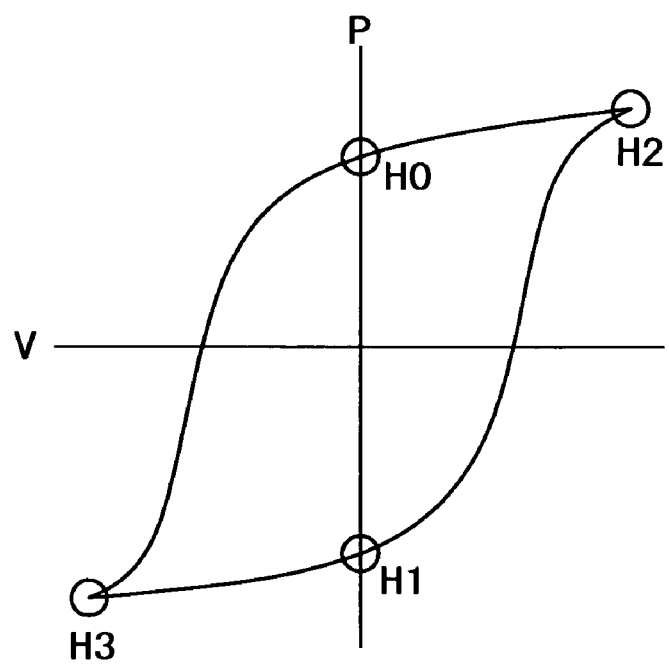
FIG. 2 is a diagram of assistance in explaining polarization operation of the ferroelectric memory.

A process of reading data of a ferroelectric memory is an operation of shifting a state of polarization to (H2) of a hysteresis loop in FIG. 2 as described above, and the process is similar to "0" writing. Hence, when "1" is thereafter written to all read cells, both "0" and "1" have been written once to each cell. Thus, whatever data is stored in the memory cells, inverted writing has been performed once.

Thus, when "1" is first written to all selected cells after reading, and then "0" is selectively written to only cells that stored "0," an imprint can be corrected without extra operation of bit line inversion, and original data can be restored by performing refresh. That is, it is not necessary to determine data contents and invert the data expressly to correct an imprint.

An example of a refresh sequence for correcting an imprint will be described with reference to FIGS. 12A and 12B. FIG. 12A is a timing chart of the refresh sequence. FIG. 12B is a diagram of assistance in explaining the refresh sequence, showing a part of configuration of a memory array.

The configuration of the memory array is as described with reference to FIG. 11, and further includes a reset circuit 70 for grounding a bit line BL, a connecting switch TCL for turning on/off connection between a sense amplifier 3 and the bit line BL, and a control line CL, as shown in FIG. 12B.

In FIG. 12A, timings constituting the refresh sequence are indicated by R1 to R6.

Timing (R1)

First the bit line BL and a node ND1 of the sense amplifier 3 are changed from 0 V to a floating state, and then a word line WL and a plate line PL are raised to Vcc. Thereby a signal read from a memory cell C appears at the node ND1 and a node ND2.

Timing (R2)

The control line CL is set to an "L" to disconnect the bit line BL and the sense node ND1 from each other.

Timing (R3)

The bit line BL is set to 0 V by using the reset circuit 70. Thereby Vcc is applied between the plate line PL and each bit line, and thus "0" is written to the selected cell. Further, the sense amplifier 3 is activated.

Timing (R4)

Next, the plate line PL is set to 0 V, and the bit line is set to Vcc by the reset circuit 70. Thereby (−Vcc) is applied between the plate line PL and each bit line, and thus "1" is written to the selected cell.

Timing (R5)

The control line CL is set to an "H" to connect the bit line BL and the sense node ND1 with each other, so that the data of the sense node ND1 is put on the bit line BL. Further, the plate line PL is set to Vcc again. Thereby Vcc is applied to only a capacitor of the bit line that stored "0," whereby "0" is restored.

Timing (R6)

The plate line PL, each bit line BL, and the word line WL are sequentially lowered to 0 V to complete the refresh operation.

Such a refresh sequence eliminates the need for writing inverted data after data determination, and therefore the sequence is simplified. Since the writing of "1" before the restoration is performed by using the separate reset circuit irrespective of the read data, there is no need for waiting for a result of the determination, and the operation is stable.

Incidentally, in this sequence example, the bit line BL is decreased to 0 V in the timing (R3) after reading, to intentionally write "0." However, since the signal generated in the bit line BL by the reading in the timing (R1) is usually sufficiently small, substantially "0" is written at this point in time. Therefore, the operation in the timing (R3) may be omitted.

Thus, by adding such a sequence at the time of refresh, it is possible to prevent an imprint of ferroelectric film, and prevent erroneous reading and erroneous writing attendant on the imprint.

Incidentally, the refresh sequence provides the same effects when used not only at the time of periodic refresh but also at the time of turning on power and at the time of refresh based on an external command.

The above-mentioned operation of writing "1" to all selected cells represents temporal overhead in normal reading operation. It is therefore desirable that this operation be performed only at the time of refresh and not be performed in normal access.

As is understood from the above description, the information processing apparatus or the semiconductor memory according to the present invention periodically refreshes a high-speed nonvolatile memory cell having spontaneous data storing capability at the time of nonuse of the apparatus (or at the time of standby of the memory) by refresh controlling means.

Thus a combination of the spontaneous data retaining capability of the nonvolatile memory cell, the periodic refresh at the time of nonuse, and intermittent power supply by turning on/off switch means makes it possible to retain data reliably while minimizing power consumption at the time of standby.

It is thereby possible to realize a memory system that can retain data reliably with minimum power consumption and enable high-speed access.

Further, the need for providing a large margin for data retention degradation to a cell signal as in a common high-speed nonvolatile memory is eliminated. It is thus possible to miniaturize the memory cells and reduce bit cost.

While preferred embodiments of the invention have been described using specific terms, such description is for illustrative purposes only, and it is to be understood that changes and variations may be made without departing from the spirit or scope of the following claims.

What is claimed is:

1. An information processing apparatus comprising:
semiconductor memory means including a plurality of nonvolatile memory cells;
switch means for turning on and off power supplied for refresh operation of said semiconductor memory means during a nonuse period of the apparatus; and
refresh control means supplied with power at all times even during said nonuse period, for effecting control to turn on said switch means and performing the refresh operation of said nonvolatile memory cells during said nonuse period.

2. The information processing apparatus as claimed in claim 1,
wherein said refresh control means periodically effects control to turn on said switch means;
specifies an address of said nonvolatile memory cell, and performs the refresh operation of said nonvolatile memory cell corresponding to the specified address; and
then effects control to turn off said switch means.

3. The information processing apparatus as claimed in claim 1,
wherein said nonvolatile memory cells have one of:
a structure using ferroelectric film as storing material, and storing data of two values or more by difference in polarization direction of said ferroelectric film;
a structure using magnetic film as storing material, and storing data of two values or more by difference in magnetization direction of said magnetic film; and
a structure using chalcogenide film as storing material, and storing data of two values or more by difference in crystal state of said chalcogenide film.

4. The information processing apparatus as claimed in claim 1,
wherein said switch means and said refresh control means are included within a memory chip including said semiconductor memory means.

5. A semiconductor memory comprising:
a nonvolatile memory cell; and
a signal generating unit for generating a signal to perform refresh operation of said nonvolatile memory cell corresponding to an address inputted to an address terminal in response to turning on of power to a power supply terminal.

6. The semiconductor memory as claimed in claim 5,
wherein said nonvolatile memory cell includes a ferroelectric capacitor using ferroelectric film as storing material, and storing data of two values or more by difference in polarization direction of said ferroelectric film; and
at a time of said refresh operation, after operation of reading data from a memory cell group to be refreshed, data of "1" is written to said entire memory cell group, and then the data stored in said memory cell group is restored.

7. (Amended) The semiconductor memory as claimed in claim 5,
wherein said nonvolatile memory cell has one of:
a structure using ferroelectric film as storing material, and storing data of two values or more by difference in polarization direction of said ferroelectric film;
a structure using magnetic film as storing material, and storing data of two values or more by difference in magnetization direction of said magnetic film; and
a structure using chalcogenide film as storing material, and storing data of two values or more by difference in crystal state of said chalcogenide film.

8. A semiconductor memory comprising:
a nonvolatile memory cell;
switch means for turning on and off power supplied for refresh operation of said nonvolatile memory cell; and
refresh control means supplied with power even during an off period of said switch means, for effecting control to turn on said switch means and performing the refresh operation of said nonvolatile memory cell during said off period.

9. The semiconductor memory as claimed in claim 8,
wherein said refresh control means periodically effects control to turn on said switch means;
specifies an address of said nonvolatile memory cell, and performs the refresh operation of said nonvolatile memory cell corresponding to the specified address; and
then effects control to turn off said switch means.

10. The semiconductor memory as claimed in claim 8, further comprising:
a first power supply terminal supplied with main power;
a second power supply terminal supplied with backup power at all times; and
power sensing means for monitoring a state of power supply from said first power supply terminal, and supplying said refresh control means with a performance control signal in response to a power supply voltage from said first power supply terminal becoming a predetermined value or lower;
wherein said switch means turns on and off power supplied via said second power supply terminal for the refresh operation of said nonvolatile memory cell; and
said refresh control means effects control to turn on said switch means in response to said performance control signal supplied from said power sensing means and performs the refresh operation of said nonvolatile memory cell.

11. The semiconductor memory as claimed in claim 8,
wherein said nonvolatile memory cell has one of:
a structure using ferroelectric film as storing material, and storing data of two values or more by difference in polarization direction of said ferroelectric film;
a structure using magnetic film as storing material, and storing data of two values or more by difference in magnetization direction of said magnetic film; and
a structure using chalcogenide film as storing material, and storing data of two values or more by difference in crystal state of said chalcogenide film.

12. The semiconductor memory as claimed in claim 8,
wherein said nonvolatile memory cell includes a ferroelectric capacitor using ferroelectric film as storing material, and storing data of two values or more by difference in polarization direction of said ferroelectric film; and at a time of said refresh operation, after operation of reading data from a memory cell group to be refreshed, data of "1" is written to said entire memory cell group, and then the data stored in said memory cell group is restored.

* * * * *